(12) United States Patent
Sidles et al.

(10) Patent No.: US 9,810,758 B2
(45) Date of Patent: Nov. 7, 2017

(54) METHOD AND SYSTEM FOR CONCENTRATING MAGNETIZATION OF NUCLEAR SPINS

(71) Applicant: University of Washington through its Center for Commercialization, Seattle, WA (US)

(72) Inventors: John A. Sidles, Seattle, WA (US); Jon Jacky, Seattle, WA (US); Joseph L. Garbini, Seattle, WA (US); Rico Picone, Seattle, WA (US)

(73) Assignee: University of Washington Through its Center for Commercialization, Seattle, WA (US)

( * ) Notice: Subject to any disclaimer, the term of this patent is extended or adjusted under 35 U.S.C. 154(b) by 476 days.

(21) Appl. No.: 14/415,820

(22) PCT Filed: Jul. 23, 2013

(86) PCT No.: PCT/US2013/051714
§ 371 (c)(1),
(2) Date: Jan. 20, 2015

(87) PCT Pub. No.: WO2014/018548
PCT Pub. Date: Jan. 30, 2014

(65) Prior Publication Data
US 2015/0185306 A1 Jul. 2, 2015

Related U.S. Application Data

(60) Provisional application No. 61/674,786, filed on Jul. 23, 2012.

(51) Int. Cl.
*G01R 33/34* (2006.01)
*G01R 33/60* (2006.01)
(Continued)

(52) U.S. Cl.
CPC ....... *G01R 33/543* (2013.01); *G01R 33/1284* (2013.01); *G01R 33/34* (2013.01);
(Continued)

(58) Field of Classification Search
CPC .............. G01R 33/543; G01R 33/1284; G01R 33/3808; G01R 33/60; G01R 33/34; G01R 33/383; G01R 33/3815; G01R 33/385
See application file for complete search history.

(56) References Cited

U.S. PATENT DOCUMENTS 2,102,671 A  12/1937  Black
5,166,615 A  11/1992  Sidles et al.
(Continued)

OTHER PUBLICATIONS

Picone, et al., "Separatory magnetic transport (SMT) in magnetic resonance force microscopy: macroscopic theory & experiment," presented at NanoMRI Conference 2012, Ascona, Switzerland, Jul. 26, 2012 (invited speaker).
(Continued)

*Primary Examiner* — G. M. Hyder
(74) *Attorney, Agent, or Firm* — McDonnell Boehnen Hulbert & Berghoff LLP (57) ABSTRACT

Apparatuses and methods are provided for concentrating the magnetization of nuclear spins within a body, in one apparatus, a body having an electron spin moments and nuclear spin moments may subject to a polarizing magnetic field and a gradient magnetic field, such that a space-varied distribution of magnetic resonant frequencies of respective electron spin moments in the body is induced. The body may then be subject to a time-varying magnetic field configured to induce a spatial gradient of the electron spin magnetization such that concentrations of nuclear spin magnetization are induced. The body may be configured to receive a biological sample such that a concentration of nuclear spin magneti-
(Continued)

zation may diffuse into the biological sample. The apparatus may further include a sensor configured to detect nuclear spin magnetization within the biological sample.

21 Claims, 3 Drawing Sheets (51) Int. Cl.
```
G01R 33/54      (2006.01)
G01R 33/12      (2006.01)
G01R 33/38      (2006.01)
G01R 33/383     (2006.01)
G01R 33/3815    (2006.01)
G01R 33/385     (2006.01)
```
(52) U.S. Cl.
CPC ....... *G01R 33/383* (2013.01); *G01R 33/3808* (2013.01); *G01R 33/60* (2013.01); *G01R 33/385* (2013.01); *G01R 33/3815* (2013.01)

(56) References Cited

U.S. PATENT DOCUMENTS

| | | | |
|---|---|---|---|
| 5,266,896 | A | 11/1993 | Rugar et al. |
| 5,528,146 | A | 6/1996 | Kwiram et al. |
| 6,100,687 | A | 8/2000 | Weitekamp et al. |
| 2001/0043065 | A1 | 11/2001 | Heid et al. |
| 2005/0110495 | A1 | 5/2005 | Kitagawa et al. |

OTHER PUBLICATIONS

Sidles, et al.,"Quantum Spin Microscopy's Emerging Methods, Roadmaps, and Enterprises," presented as Poster #PA-15 at the 52nd Experimental Nuclear Magnetic Resonance Conference (ENC 2011), 1 page, 2011.

Sidles, "Spin microscopy's heritage, achievements, and prospects," Proceedings of the National Academy of Sciences USA, vol. 106, No. 8, pp. 2477-2478, 2009.

Sidles, "The Natural Elements of Separatory Transport: a Guidance for Enterprise in Quantum Systems Engineering," one-page math syllabus of the 2012 UW/ISH Intent and Guidance Seminar (I&G), available online at: https://web.archive.org/web/20120403144553/http://faculty.washington.edu/sidles/ENC_2011/Onsager_transport.pdf, 2012.

Sidles, "The Synthesis for Healing Our Warriors (SHOW): Objectives, Approach, State-of-the-Art, and Novelty," standalone poster available online at: https://web.archive.org/web/20120208051320/http://faculty.washington.edu/sidles/FRIAS_2011/UW_ISH_soldiers_chart.pdf, 2011.

Sidles, "The Synthesis for Healing Our Warriors (SHOW): the Guiding Intent and Strategic Synthesis," standalone poster available online at: https://web.archive.org/web/20120208051320/http://faculty.washington.edu/sidles/FRIAS_2011/UW_ISH_soldiers_strategy.pdf, 2011.

Sidles, et al., "Elements of naturality in dynamical simulation frameworks for Hamiltonian, thermostatic, and Lindbladian flows on classical and quantum state-spaces," available online at: https://arxiv.org/abs/1007.1958, 2010.

Sidles, et al., "Practical recipes for the model order reduction, dynamical simulation and compressive sampling of large-scale open quantum systems," New Journal of Physics, vol. 11, No. 6, 065002, 2009.

Sidles, et al., "Quantum Spin Microscopy's Emerging Methods, Roadmaps, and Enterprises," a handout publicly distributed at the 52nd Experimental Nuclear Magnetic Resonance Conference (ENC 2011), 16 pages, available online at: https://web.archive.org/web/20110608060203/http://faculty.washington.edu/sidles/ENC_2011/UW_ENC_2011_handout_015.pdf, 2011.

Sidles, et al., "Quantum Spin Microscopy's Emerging Methods, Roadmaps, and Enterprises," a poster from the 52nd Experimental Nuclear Magnetic Resonance Conference (ENC 2011), 16 pages, available online at: https://web.archive.org/web/20110608060203/http://faculty.washington.edu/sidles/ENC_2011/UW_ENC_2011_poster_015.pdf, 2011.

Sidles, et al., "The theory of oscillator-coupled magnetic resonance with potential applications to molecular imaging," Review of Scientific Instruments, vol. 63, No. 8, pp. 3881-3899, 1992.

International Search Report for PCT/US2013/051714, dated Nov. 19, 2013.

METHOD AND SYSTEM FOR CONCENTRATING MAGNETIZATION OF NUCLEAR SPINS

CROSS-REFERENCE TO RELATED APPLICATION

This application is a U.S. national phase of International Application No. PCT/US2013/051714 filed on Jul. 23, 2013, which claims benefit of U.S. Provisional Application No. 61/674,786, filed Jul. 23, 2012, both of which are incorporated by reference herein in their entirety.

STATEMENT OF GOVERNMENT SUPPORT

This invention was made with government support under W911NF-05-1-0403, awarded by the U.S. Army Research Office. The government has certain rights in the invention.

BACKGROUND

In physical science disciplines, such as that of quantum mechanics and particle physics, a spin magnetic moment may be defined as the magnetic moment induced by the spin of elementary particles, such as an electron or a nucleus of a nuclear particle. In this context, "spin" may be a non-classical property of elementary particles, because classically, the "spin" of a material object may be defined as the total orbital angular momentum of constituents of the material object about a rotational axis of the material object. Elementary particles however, may be conceived as points, and may therefore not have an axis to "spin" about.

The magnetic moment induced by the spin of the elementary particle may be defined in terms of an electric current and the area enclosed by a loop of the electric current. Since angular momentum corresponds to rotational motion, the magnetic moment may be related to the orbital angular momentum of the charge carriers constituting the current. Further, in magnetic materials, atomic and molecular dipoles may have magnetic moments due to the spin of elementary particles constituting the magnetic material in addition to any quantized orbital angular momentum present. In fact, in some cases an elementary particle may not necessarily have electric charge to have a spin magnetic moment. For instance, a neutron, despite being electrically neutral, may have a non-zero magnetic moment due to an internal quark structure of the neutron.

In the context of the present application, electron spin may refer to an intrinsic angular momentum of an electron, and a nuclear spin may refer to an angular momentum of the nucleus of a nuclear particle, as briefly discussed above.

SUMMARY

In one aspect, an apparatus is provided. The apparatus includes a body having nuclear spin moments and electron spin moments within at least a portion of the body. The apparatus also includes a magnetic device configured to provide a static magnetic field within the portion of the body. The static magnetic field is configured to (a) cause a nuclear spin magnetization carried by respective pairs of the nuclear spin moments to be substantially pairwise conserved, (b) substantially align the electron spin moments with a direction of the static magnetic field, and (c) induce a space-varied distribution of magnetic resonance frequencies of respective electron spin moments. The apparatus further includes an alternating-field magnet configured to provide a time-varying magnetic field across the portion of the body. The time-varying magnetic field is configured to induce a spatial gradient in a local magnetization of the respective electron spin moments such that concentrations of the nuclear spin magnetizations carried by respective pairs of the nuclear spin moments are spatially varied according to the spatial gradient in local magnetization of the respective electron spin moments.

In another aspect, a first method is provided. The first method involves applying a static magnetic field across at least a portion of a body to (a) cause a nuclear spin magnetization carried by respective pairs of the nuclear spin moments to be substantially pairwise conserved, (b) substantially align the electron spin moments with a direction of the first magnetic field, and (c) induce a space-varied distribution of magnetic resonance frequencies of respective electron spin moments. The first method also involves activating an alternating-field magnet to provide a time-varying magnetic field across at least the portion of the body. The time-varying magnetic field is configured to induce a spatial gradient in local magnetizations of the electron spin moments such that concentrations of the nuclear spin magnetizations carried by respective pairs of nuclear spin moments in at least the portion of the body are spatially variable according to the spatial gradient in local magnetization of the respective electron spin moments.

In a further aspect, a non-transitory computer readable medium is provided. The non-transitory computer readable medium has stored thereon instructions executable by a computing device to perform functions. The functions include detecting a space-varied distribution of magnetic resonance frequencies of electron spin moments in at least a portion of a body, and determining a time-varying magnetic field based on the detected space-varied distribution of magnetic resonance frequencies of electron spin moments. The time-varying magnetic field is configured to induce a spatial gradient in local magnetizations of the electron spin moments such that concentrations of nuclear spin magnetizations in the body are spatially varied according to the spatial gradient in local magnetization of the respective electron spin moments. The functions also include activating an alternating-field magnet to provide the time-varying magnetic field across at least the portion of the body.

In yet another aspect, a second method is provided. The second method involves detecting a space-varied distribution of magnetic resonance frequencies of electron spin moments in at least a portion of a body, and determining a time-varying magnetic field based on the detected space-varied distribution of magnetic resonance frequencies of electron spin moments. The time-varying magnetic field is configured to induce a spatial gradient in local magnetizations of the electron spin moments such that concentrations of nuclear spin magnetizations in the body are spatially varied according to the spatial gradient in local magnetization of the respective electron spin moments. The second method also involves activating an alternating-field magnet to provide the time-varying magnetic field across at least the portion of the body.

DETAILED DESCRIPTION

The present application is directed to apparatuses and processes for magnetizing substances and, in particular, magnetizing substances by inducing a separatory spatial transport of spin magnetization within the substances.

A. Overview Of Separatory Magnetization Transport

This overview section provides a general discussion of principles within the context of quantum physics applicable towards the concept of separatory magnetic transport. Embodiments for the implementation and practical application of separatory magnetic transport can be found in the following section.

Separatory magnetic transport is a process by which transport of magnetic spin moments through spin-spin interactions is such that the ratio of "up" spins to "down" spins in some region is further from unity than occurs from external magnetic fields. In other words, separatory magnetic transport may involve local concentration of magnetization. In the presence of spatially-varying magnetic fields, separatory magnetic transport locally concentrates magnetization when two magnetic spin species are present, one of which has a locally non-equilibrium spatial gradient.

Discussions of theory, methods, and apparatus associated with separatory transport processes of quantities other than spin magnetization may include the following: "Reciprocal Relations in Irreversible Processes" by Lars Onsager (1931); "The Theory of the Separation of Isotopes by Statistical Methods" by Paul A. M. Dirac (circa 1941); "The Application of Onsager's Reciprocal Relations to Thermoelectric, Thermomagnetic, and Galvanomagnetic Effects" by Herbert B. Callen (1948); *The Theory of Isotope Separation as Applied to the Large Scale Production of $U^{235}$* by Karl Cohen (1951); "Onsager's Pancake Approximation for the Fluid Dynamics of a Gas Centrifuge" by Houston G. Wood and J. B. Morton (1980); "Isotope Separation by Distillation: Design of a Carbon-13 Plant" by Berthus Boston McInteer (1980); *Unified Separation Science* by J. Calvin Giddings (1991); *Transport Phenomena*, by R. Byron Bird. Warren E. Stewart, and Edwin N. Lightfoot (2007); and "The Future of Seawater Desalination: Energy, Technology, and the Environment" by M. Elimelech and W. A. Phillip (2011).

The discussions in the above-mentioned publications cover different separatory transport concepts, including for example:

1. separation of less massive hydrocarbon molecules (such as benzene) from molecules of relative greater mass (such as kerosene) by separatory transport within fractional distillation towers;

2. separation of less massive nuclear isotopes (such as 235U or 12C) from relatively more massive nuclear isotopes (such as 238U or 13C);

3. separation of electric charge, so as to yield a useful electric voltage different, by application of a temperature gradient (i.e., thermoelectric power generation);

4. separation of heat, so as to yield a useful temperature differential, by application of an electric voltage difference (i.e., thermoelectric heating/cooling); and 5. transportation of water molecules separatively from cationic/anionic molecules (i.e., salt molecules) so as to yield fresh water and brine outflow from a seawater inflow.

In some of the above-mentioned examples, the separatory spatial transport may not perfectly conserve the transported quantity. For instance, separated uranium isotopes may decay radioactively. Thus, it may be desirable that substantial separation occur on a timescale comparable to, or shorter than, the natural timescale of decay of the separated quantity. Exact conservation of the quantity to be separatively transported may not, however, be essential to the utility of the separatory transport.

The above-mentioned examples may be thermodynamically similar such that a product of a respective separatory transport may be spatially concentrated and purified. As a result of the concentration and purification, a thermodynamic entropy density of the product may decrease relative to the feedstock. However, the laws of thermodynamics require that the decrease in spatially-localized entropy be compensated elsewhere by a local increase in entropy, such that the aggregate entropy increases. In some cases, the required global entropy increase may be associated with an entropic cost of sustaining spatial gradients in thermodynamic potentials. In the above-mentioned examples of separatory transport, the externally applied potential gradients for sustaining the separatory transport, and for concomitantly acting to increase the global entropy may include spatial gradients variable in temperature, pressure, centrifugal force regarded as a gravity potential gradient, and gradients in electric potential associated to an applied electric field.

The general thermodynamic principles by which the above-mentioned examples may accomplish separatory spatial transport may be mathematically represented by equations [Eq01]-[Eq39] shown in Tables 1-7.

TABLE 1

Natural mathematical operations[a] on manifolds:

| | | |
|---|---|---|
| $d :=$ | $\begin{cases} \text{the exterior derivative} \\ \text{(naturalizes the "grad" } \vec{\nabla}) \end{cases}$ | [Eq01] |
| $\wedge, \lrcorner, [\hat{\cdot}] :=$ | $\begin{cases} \text{the exterior product "} \wedge \text{", interior product "} \lrcorner \text{", and bundle isomorphism "} [\hat{\cdot}] \text{",} \\ \text{naturalize the operations "cross" } \vec{A} \times \vec{B}, \\ \text{"dot" } \vec{A} \cdot \vec{B}, \text{ and "matrix product" } \overleftrightarrow{A} \cdot \vec{B} \end{cases}$ | [Eq02] |
| $\hat{g}, \hat{\omega} :=$ | $\begin{cases} \text{the metric and symplectic bundle} \\ \text{isomorphisms TM} \to T^*M \text{ that are} \\ \text{induced by the metric structure g} \\ \text{and the symplectic structure } \omega \end{cases}$ | [Eq03] |
| $\{\cdot, \cdot\} :=$ | $\begin{cases} \text{the Poisson bracket; for f, h:M} \to \mathbb{R}, \\ \text{defined to be (f, h)} := (df, dh)_{\omega^{-1}} \end{cases}$ | [Eq04] |
| $*, *\omega :=$ | $\begin{cases} \text{the metric and symplectic Hodge duals} \\ \text{(when acting on k-forms, with } *(1) \text{ an} \\ \text{n-form, the inverse operations are} \\ *^{-1} = (-1)^{k(n-k)} * \text{ and } *_\omega^{-1} = *_\omega) \end{cases}$ | [Eq05] |

TABLE 1-continued

Natural mathematical operations[a] on manifolds:

$\flat, \sharp :=$ $\begin{cases} \text{the musical metric dualities} \\ \text{(naturalize lowering and raising} \\ \flat X := *^{-1} (X \lrcorner *(1)) \text{ and } \sharp := \flat^{-1}) \end{cases}$ [Eq06]

$d^* :=$ $\begin{cases} \text{the Hodge codifferential (acting} \\ \text{on a k-form, } d^* := (-1)^k *^{-1} d *) \end{cases}$ [Eq07]

$\hookrightarrow, \leftarrow :=$ $\begin{cases} \text{inclusion and pullback (these naturalize} \\ \text{the classical} \leftrightarrow \text{quantum inclusion} \\ \text{and model reduction} \leftarrow \text{by pullback} \end{cases}$ [Eq08]

[a] The notational conventions that are adopted in [Eq01]--[Eq39] substantially follow (or in some instances are natural thermometric extensions of) the conventions of John M. Lee's textbook "Introduction to Smooth Manifolds" (2nd Edition, Springer Gradiate Texts in Mathematics, 2013). In particular, the various propositions, corollaries, and examples 12.1--12.12 of Lee's text book inform the multi-index notational convention that is herein adopted for thermometric tensors (see [Eq25]).

TABLE 2

Dynamical trajectories on the microscopic symplectic manifold M:

$\mathcal{H} :=$ {the Hamiltonian potential (see [Eq26])}[a] [Eq09]

$\underline{C} :=$ $\begin{cases} \text{the Carmichael unraveling form}^b \\ \text{(a covector field whose components} \\ \text{are stochastic increments, see [Eq26])} \end{cases}$ [Eq10]

$\underline{X} :=$ $\begin{cases} \text{the dynamical flow on M} \\ \text{(a vector field whose components} \\ \text{are stochastic increments, see [Eq26])} \end{cases}$ [Eq11]

$Q :=$ $\begin{cases} \text{a covector space } Q = \Sigma_i Q_i e^i \text{ of Poisson-} \\ \text{commuting functions on M (see [Eq27]);} \\ \text{the Q-cobasis } (e^i) \text{ is Legendre-dual to a} \\ \mu\text{-basis } (c_i) \text{ of thermodyanmic potentials} \\ \text{(see [Eq33] and note "a" of [Eq25])} \end{cases}$ [Eq12]

$q :=$ $\begin{cases} \text{values of conserved quantities} \\ \text{(a Q-covector } q = \Sigma_i q_i e^i \text{ of Q values} \\ \text{on a level-set of M, see [Eq29])} \end{cases}$ [Eq13]

$S_{MAX}(q) :=$ $\begin{cases} \text{entropy of the level set of q} \\ \text{(as specified by the state-space} \\ \text{volume integral of [Eq28])} \end{cases}$ [Eq14]

[a] In overview, trajectories on M are symplectic integral curves (see [Eq20]) of a Hamiltonian convector field dH (see [Eq9]), additively combined with a covector field $\underline{C}$--that typically is specified by pullback onto M (see [Eq08]) from a Hilbert space--whose components are Itô/Stratonovich stochastic increments (see [Eq10]) that specify Lindblad-type noise and/or observation processes as Carmichael-type trajectory unravellings.
[b] Three crucial roles associated to the $\underline{C}$-field are: first, spatial localization by quenching of "Schrödinger cat" trajectories (see [Eq29]); second, provision of the stochastic datastreams that enter in the BLOCKS relations (see [Eq37]); third, compression of trajectories onto low-dimension submanifolds of M, such that the dynamical forms $\{\omega, \mathcal{H}, \underline{C}\}$ (see [Eq26]), when pulled-back onto said submanifolds, are computationally efficient to integrate (by [Eq26] on the submanifold), and the datastream $\rho(t)$ thus simulated is thermodynamically accurate.

TABLE 3

Thermometric quantities upon a transport manifold $\mathfrak{U}$:

$\rho(t) :=$ $\begin{cases} \text{the time-dependent spatial density} \\ \rho(t) = \Sigma_i \rho_i(t) e^i \text{ is specified by the con-} \\ \text{tinuous quantum observation processes} \\ \text{of the BLOCKS relations (see [Eq37]);} \\ \text{spatially the } \rho\text{-density is a 0-form} \\ \text{whose Hodge-dual } *\rho \text{ is a top form whose} \\ \text{spatial integral is q (see [Eq29])} \end{cases}$ [Eq15]

$s(\rho) :=$ $\begin{cases} \text{a local entropy density } s(\rho); \text{ asso-} \\ \text{ciated to local } \rho\text{-quantities by the} \\ \text{BLOCKS relations (see [Eq37])} \end{cases}$ [Eq16]

$J :=$ $\begin{cases} \text{the transport current; a thermometric} \\ \text{tensor}^b \text{ of type } \begin{pmatrix} 0 \\ 1 \end{pmatrix}; \text{ expands in multi-} \\ \text{index components as } J = \Sigma_{i\alpha} J_{i\alpha}(e^i dr^\alpha) \end{cases}$ [Eq17]

$V :=$ $\begin{cases} \text{advective flow; a field of tangent vectors} \\ \text{on the base-manifold } \mathfrak{U}; \text{ a purely spatial} \\ \text{flow that is not Q-indexed (see [Eq31])} \end{cases}$ [Eq18]

$\mathfrak{D}(\rho) :=$ $\begin{cases} \text{the transport tensor; a type-} \begin{pmatrix} 1 \\ 1 \end{pmatrix} \text{ multi-} \\ \text{index tensor bundle section (see [Eq25])} \\ \text{from which Onsager's kinetic structure} \\ \mathcal{F}(\mu(\rho)) \text{ (of [Eq23]) is derived} \end{cases}$ [Eq19]

$\alpha(\mu) :=$ $\begin{cases} \text{the free energy (per unit volume) } \alpha(\mu) \\ \text{is Legendre-dual (see [Eq33]) to the} \\ \text{entropy (per unit volume) } s(\rho) \end{cases}$ [Eq20]

$\mu(\rho) :=$ $\begin{cases} \text{the thermodynamic } \mu\text{-potential}^c \mu = \Sigma_i \mu^i e_i \\ \text{is the Legendre dual (see [Eq33]) of the} \\ \rho\text{-quantity } \rho = \Sigma_i \rho_i e^i \text{ (see note "a" of} \\ \text{[Eq25] for basis indexing conventions)} \end{cases}$ [Eq21]

[a] The convexity of the entropy $s(\rho)$ and the Legendre duality relations among $\{\rho, s(\rho)\} \rightleftarrows \{\mu, \alpha(\mu)\}$ (see [Eq33]) ensure that the free energy $\alpha(\mu)$ is convex and $\mu(\rho)$ and $\rho(\mu)$ both are monotonic.
[b] The component expansion of J multiplies "$\gamma$"-indexed (upper-position) thermometric basis vectors ($e^i dr^\alpha$) by "b"-indexed (lower-position) components $J_{i\alpha}$ (see [Eq25] and [Eq31]).

TABLE 4

Thermometric structures and index conventions:

$\mathfrak{H}(\mu(\rho)) :=$ $\begin{cases} \text{the thermometric structure (of [Eq38]);} \\ \text{a type-} \begin{pmatrix} 0 \\ 2 \end{pmatrix} \text{ structure (per [Eq25]);} \\ \text{this structure is positive-definite} \\ \text{by convexity of the entropy } s(\rho) \end{cases}$ [Eq22]

TABLE 4-continued

Thermometric structures and index conventions:

$\mathcal{F}(\mu(\rho)) := \begin{cases} \text{Onsager's kinetic coefficients (of [Eq34]);} \\ \text{a type-}\binom{0}{2}\text{ structure (per [Eq25]); the} \\ \text{Second Law requires that }\mathcal{F}\text{ be positive-} \\ \text{definite; the OZ matrix ansatz (of} \\ \text{[Eq24] and [Eq39]) postulates }\mathcal{F} \propto \mathcal{G} \end{cases}$ [Eq23]

$\Gamma_{oz} := \begin{cases} \text{the OZMA coefficient }\Gamma_{oz}\text{ (of [Eq39])} \\ \text{specifies a transport scale having} \\ \text{Système International units m}^2 \cdot \text{s}^{-1} \\ \text{(which are the units of diffusion)} \end{cases}$ [Eq24]

$\binom{n}{m} := \begin{cases} \text{the thermometric multi-index convention}^a \\ \text{given a coordinate basis (dr}^a\text{), }\rho\text{-form com-} \\ \text{ponents near "b"-indices (lower-position in-} \\ \text{dices, e.g., d}\rho = \Sigma_{ia}(\partial\rho_i/\partial r^a)(e^i dr^a) = \\ \Sigma_{ia}[d\rho]_{ia}(e^i dr^a));\ \mu\text{-tangent components} \\ \text{bear "}\mathcal{G}\text{"-indices (upper-position indices,} \\ \text{e.g., }\mathcal{G}d\mu = \Sigma_{i\beta\gamma}g^{\beta\gamma}(\partial\mu^i/\partial r^\gamma)(e_i\partial_{,\beta}) = \\ \Sigma_{i\beta}[\mathcal{G}d\mu]^{j\beta}(e_j\partial_{,\beta}));\text{ and type-}\binom{n}{m}\text{ tensors} \\ \text{bear component multi-indices to the basis} \\ \begin{pmatrix} \text{(tangent bases }\partial_{,\beta}, \\ \mu\text{-potential units }e_i)^{\otimes n} \\ \text{(cobasis 1-forms dr}^a, \\ \rho\text{-quantity units }e^i)^{\otimes m} \end{pmatrix} \end{cases}$ [Eq25]

[a]For example, the Legendre product $\rho \cdot \mu$ (of [Eq33]) has the component expansion $\rho \cdot \mu = \Sigma_{ij}(\rho_i e^i)(\mu^j e_j) = \Sigma_{ij}\rho_i\mu^j(e^i(e_j)) = \Sigma_{ij}\rho_i\mu^j\delta_j^i = \Sigma_i\rho_i\mu^i$ (by [Eq15] and [Eq21]). More generally the thermometric structures $\mathcal{F}$ (of [Eq34]) and $\mathcal{G}$ (of [Eq38]) both are tensors of type $\binom{0}{2}$; thus both act to lower the "$\mathcal{G}$" component multi-indices of $\mathcal{G}d\mu$ (see [Eq34]) to the "b" multi-indices of the transport current J (see [Eq17]); the shared tensor-type of $\mathcal{F}$ and $\mathcal{G}$ establishes the thermometric naturality of the Onsager-Ziegler matrix ansatz (of [Eq39]).

TABLE 5

Dynamical trajectories upon a symplectic manifold M:[a]

| | | |
|---|---|---|
| $\underline{X} \rfloor \omega = dH + \underline{C}$ | (trajectories are symplectic integral curves of covector fields; stochastic increments are denoted by underscores $\underline{|}$) | [Eq26] |
| $0 = \{H, Q\}$ | (conserved functions are Q-bundle basis vectors) | [Eq27] |
| $S_{MAX}(q) = \log \int_{M^*_W} \delta(q - Q)$ | (the entropy $S_{MAX}(q)$ is the log-symplectic volume of a q-vector level-set) | [Eq28] |

Localization, the First Law, and transport currents upon a metric manifold U:[b]

| | | |
|---|---|---|
| $q = \int_u * \rho(t)$ | (the spatial density $\rho(t)$ (see [Eq15]) and its integrated q-quantity (see [Eq13]) share the Q-cobasis ($e^i$) (of [Eq12])) | [Eq29] |
| $\partial_t \rho(t) = d^\circ J(\rho(t))$ | (First Law of Thermodynamics: conservation of q-quantity) | [Eq30] |

TABLE 5-continued

| | | |
|---|---|---|
| $J(\rho) = -\hat{\mathcal{D}}(\rho)(d\rho)$<br>$+ J_0(\rho)$<br>$+ \rho \wedge (bV)$ | (d$\rho$-driven gradient current[c] + entropic gradient current + advective transport current) | [Eq31] |

[a]Typically the symplectic manifold M supports microscopic many-body trajectory unravelling (by integration of [Eq26]), for which a macroscopic description is sought in terms of transport currents J (see [Eq17]) that are driven by gradients of thermodynamic potentials (see [Eq31] and [Eq34]).

[b]Typically the metric manifold U is a macroscopic spatial manifold that supports transport currents J; these currents are inferred from (observed or simulated) trajectory unravellings on M via the BLOCKS relations (of [Eq37]).

[c]Note that [Eq31] describes transport currents J as d$\rho$-driven in part (that is, driven in part by $\rho$-gradients). An equivalent yet simpler expression (see [Eq34]) describes J as exclusively d$\mu$-driven (that is, driven exclusively by $\mu$-gradients).

TABLE 6

Thermodynamic potentials, the Zeroth, Second, and Third Laws, and Onsager's reciprocity relations:

| | | |
|---|---|---|
| $\mathcal{S}(t) = \int_u * s(\mu(t))$ | (the local entropy density $s(\rho(t))$ integrates to the total entropy $\mathcal{S}(t) \leq S_{MAX}(q)$) | [Eq32] |
| $\mu(\rho) = \partial_\rho s(\rho)$<br>$\rho \cdot \mu = s(\rho) + a(\mu)$<br>$\rho(\mu) = \partial_\mu a(\mu)$ | (the free energy $a(\mu)$ is Legendre-dual to the entropy $s(\rho)$, and the $\rho$-quantity cobasis ($e^i$) is dual to the $\mu$-potential basis ($e_i$)) | [Eq33] |
| $J(\rho) = -\hat{\mathcal{D}}(\rho)(d\rho)$<br>$+ J_0(\rho)$<br>$= \hat{\mathcal{F}}(\mu)(\mathcal{G}d\mu)$ | (Zeroth Law of Thermodynamics:[b,c] the equilibrium thermodynamic potential $\mu = \Sigma\mu^i e_i$ is spatially uniform, i.e., $d\mu = 0$) | [Eq34] |
| $\partial_t \mathcal{S} = \int_u * (\mathcal{G}d\mu, \mathcal{G}d\mu)_{\hat{\mathcal{F}}}$<br>$= \int_u * (J, J)_{\hat{\mathcal{F}}^{-1}}$<br>$\geq 0$ | (Second Law of Thermodynamics:[b] the Onsager structure $\hat{\mathcal{F}}$ induces a transport current J such that the total entropy $\mathcal{S}$ increases) | [Eq35] |
| $\exists s_0 = \inf_0 s(\rho)$<br>$\lim_{\rho \to \rho_0} s(\rho) = s_0$ iff<br>$\lim_{\rho \to \rho_0} [\mu(\rho)] = \infty$ | (Third Law Thermodynamics: the entropy function $s(\rho)$ that is specified by the BLOCKS relations (see [Eq37]) is lower-bounded by the (quantum) back-action of observation processes) | [Eq36] |

[a]The thermometric tensor indexing conventions that arise from the Legendre duality relations (of [Eq33]) are summarized (with examples) in ]Eq25].

[b]In regard to the thermometric transport structure $\mathcal{F}$ that appears in the Zeroth Law (of [Eq34]) and First Law (of [Eq35]), the Onsager reciprocity relations assert the symmetry of $\mathcal{F}$ as a tensor of type $\binom{0}{2}$. Equivalently, in regard to the BLOCKS relations (of [Eq37]), the Onsager relations assert the symmetry under t' $\to$ t$^-$ of the observed $\rho$-datastream covariance cov.

[c]This formulation of the Zeroth Law (of [Eq34]) assumes that the adjective flow V (of [Eq31]) is zero, as is characteristic of solid-state transport processes.

TABLE 7

The BLOCKS[a] relations and
the Onsager-Ziegler matrix ansatz (OZMA):

$$\lim_{t' \to t} \text{cov}[(\rho(t') - \rho(t)) \otimes (\rho(t') - \rho(t))]$$ (BLOCKS relations: continuous (quantum) Lindblad/Carmichael observation processes specify the free energy function $a(\mu)$ (and thus the entropy function $s(\rho)$) bu Onsager's identification of the observed $\rho(t)$-covariance[b] cov with $a(\mu)$'s (Frobenius-integrable) Hessian) [Eq37]

$$= \left( \frac{\partial^2 \alpha(\mu)}{\partial \mu^i \partial \mu^j} e^i \otimes e^j \right)$$

$$= \left( \frac{\partial^2 s(\rho)}{\partial \rho_i \partial \rho_j} e_i \otimes e_j \right)^{-1}$$

$$\mathcal{G}(\mu(\rho)) = -g_{\alpha\beta} \frac{\partial^2 \alpha(\mu)}{\partial \mu^i \partial \mu^j} \times (e^i dr^\alpha) \otimes (e^j dr^\beta)$$ (the free-energy Hessian of the BLOCKS relations observationally specifies a natural thermometric structure $\mathcal{G}$ on $T_G^M$) [Eq38]

$$\mathcal{F}(\mu(\rho)) = \Gamma_{\infty} \mathcal{G}(\mu(\rho))$$ (the Onsager-Ziegler matrix ansatz (OZMA)[c]) [Eq39]

[a] The Boltzmann-Lindblad-Onsager-Carmichael-Kählar-Sackur (BLOCKS) relations (of [Eq37]) provide that the observed temporal covariance cov of $\rho(t)$-fluctuation -- as provided experimentally or alternatively simulated computationally, and in either case the result of quantum measurement processes -- suffices to specify the functional forms of the free energy $\alpha(\mu)$, and the entropy $s(\rho)$, and the Legendre-duality relation (of [Eq33]).
[b] Technical note: experimental and simulated datastreams $\rho(t)$ comprise an unbiased stimate of thermodynamic fluctuations additively combined with broad-band (i.e., "white") noise that reflects the quantum nature of measurement; said noise contributes (non-thermodynamic) terms to the covariance cov that are proportional to Dirac's $\delta$-function $\delta(t' - t)$; said $\delta$-functions are disregarded in taking the limit $t' \to t$ (of [Eq37]).
[c] The proportionality of $\mathcal{F}$ and $\mathcal{G}$ that the Onsager-Ziegler matrix ansatz (OZMA) (of [Eq39]) postulates is thermometrically natural in that $\mathcal{F}$ and $\mathcal{G}$ both are symmetric positive-definite tensors o type ($_2^0$) (see note "a" of [Eq25] for details).

In addition to the understanding of thermodynamic principles relating to separatory spatial transport, separatory spatial transport of spin magnetization within a substance may also involve general concepts of magnetic spin dynamics.

Discussions of theory, methods, and apparatus associated with spin dynamics may include the following: *Principles of Magnetic Resonance*, by Charles Slichter (1989); "Mechanical Detection of Magnetic Resonance" by D. Rugar, C. S. Yannoni, and J. A. Sidles (1992), U.S. Pat. No. 5,266,896—"Mechanical Detection and Imaging of Magnetic Resonance by Magnetic Moment Modulation;" and "Practical Recipes for the Model Order Reduction, Dynamical Simulation, and Compressive Sampling of Large Scale Open Quantum Systems" by J. A. Sidles, J. L. Garbini, L. E. Harrell, A. O. Hero, J. P. Jacky, J. R. Malcomb, A. G. Norman, and A. M. Williamson (2009). Concepts of spin dynamics discussed in the above mentioned publications may include, for example:

1. total energy of a spin system is substantially conserved;
2. a magnetic moment of the spin system is substantially conserved;
3. dynamics of the spin system is substantially Hamiltonian; and
4. magnetization in slices of spin-bearing substance can be substantially altered by radiofrequency irradiation.

Further, concepts relating to "hyperpolarizing" nuclear spins are discussed in U.S. Pat. No. 7,351,402 "Polarizing Agents for Dynamic Nuclear Polarization;" and "Quantum Mechanical Theory of Dynamic Nuclear Polarization in Solid Dielectrics," by Hu KanNian, G. T. Debelouchina, A. A. Smith, and Robert Griffin (2011). In one example, hyperpolarization methods may be implemented to polarize nuclear magnetic moments by electron-to-nuclear transfer of magnetic moments. The discussed hyperpolarization methods, however, differ from separatory magnetization transport mechanisms discussed below, in which the electron-to-nuclear spin polarization transfer may not be desired, while the total nuclear spin moment may be substantially conserved, and may be concentrated by transport into spatially localized regions. Further, the above-mentioned publications related to concepts of hyperpolarization do not discuss spatial thermodynamical potential gradients.

The theory of separatory magnetic transport, as suggested in [Eq34], indicates that the thermodynamical potential gradients may be necessary for the sustainment of separatory transport currents. Accordingly, embodiments discussed below for implementing separatory magnetization transport involve elements for generating such thermodynamical potential gradients. Additional elements for implementing separatory magnetization transport in view of the equations shown above in Tables 1-7 are also discussed below.

In one example, implementation of separatory magnetization transport may involve (i.) a body comprising nuclear spin moments and electron spin moments within at least a portion of the body, (ii.) a magnetic device configured to provide a static magnetic field within the portion of the body, wherein the static magnetic field is configured to (a) cause a nuclear spin magnetization carried by respective pairs of the nuclear spin moments to be substantially pairwise conserved, (b) substantially align the electron spin moments with a direction of the static magnetic field, and (c) induce a space-varied distribution of magnetic resonance frequencies of respective electron spin moments, and (iii.) an alternating-field magnet configured to provide a time-varying magnetic field across the portion of the body, wherein the time-varying magnetic field is configured to induce a spatial gradient in a local magnetization of the respective electron spin moments such that concentrations of the nuclear spin magnetizations carried by respective pairs of the nuclear spin moments are spatially varied according to the spatial gradient in the local magnetization of the respective electron spin moments.

The relationship between the special variation of the nuclear spin magnetization and the spatial gradient in the local magnetization of the respective electron spin moments are consistent with the concepts of separatory magnetization transport discussed herein. In other words, the special variation of the nuclear spin magnetization may be dependent on, proportional, and/or differentially related to the spatial gradient in the local magnetization of the respective electron spin moments. Other relational concepts and definitions may also be possible.

In operation, the implementation of separatory magnetization transport may involve (i.) applying a static magnetic field across at least a portion of a body to (a) cause a nuclear spin magnetization carried by respective pairs of the nuclear spin moments to be substantially pairwise conserved, (b) substantially align the electron spin moments with a direction of the first magnetic field, and (c) induce a space-varied distribution of magnetic resonance frequencies of respective electron spin moments, and (ii.) activating an alternating-field magnet to provide a time-varying magnetic field across at least the portion of the body, wherein the time-varying magnetic field is configured to induce a spatial gradient in local magnetizations of the electron spin moments such that concentrations of the nuclear spin magnetizations carried by respective pairs of the nuclear spin moments in at least the portion of the body are spatially variable according to the spatial gradient in the local magnetization of the respective electron spin moments.

Separatory magnetization transport, as suggested above, and as will be further discussed below, involves locally concentrating nuclear magnetization. The nuclear and electron spin magnetization may be described by the time-dependent spatial density [Eq15]. The continuity equation of the First Law of Thermodynamics may govern the flow of the time-dependent spatial density [Eq15] by means of the transport current, as shown by [Eq17], [Eq31], and [Eq34].

In particular, the expression for the transport current [Eq34] depends on two components: the gradient of the thermodynamic potential as shown by [Eq20], and Onsager's kinetic coefficients as shown by [Eq23]. The gradient of the thermodynamic potential [Eq20] provides insight into implementation of (a) the nuclear spin moments and electron spin moment, (b) the polarizing magnetic field, (c) the gradient magnetic field, (d) application of the polarizing magnetic field, and (e) application of the gradient magnetic field through the thermodynamic potential [Eq20] itself, for which a three-dimensional basis reflects corresponding three substantially conserved quantities of spin interaction energy, nuclear spin moment, and electron spin moment. Furthermore, the actualization of a gradient (as shown by [Eq01] and [Eq06]) of the thermodynamic potential may in this example be dependent on the application of the gradient magnetic field to induce an electron spin magnetization gradient (and the thermodynamic potential gradient according to [Eq20], thereby creating an entropic imbalance) in the solid body, and the application of the depolarizing magnetic field across the solid body.

In the Onsager-Ziegler matrix ansatz [Eq39], Onsager's kinetic coefficients [Eq23] may be related to the thermometric structure [Eq22] via the OZMA coefficient [Eq24], and the Onsager-Ziegler matrix ansatz [Eq39] may ensure that the Second Law of Thermodynamics is respected. Thus, given a local entropy density [Eq16] that respects the Third Law of Thermodynamics [Eq36](possibly obtained by numerical trajectory integration via the BLOCKS relations [Eq37]), all the laws of thermodynamics may naturally be assimilated into the separatory transport theory.

Through the coupling of the Onsager-Ziegler matrix ansatz [Eq39], the thermodynamic potential [Eq20] may drive the transport current [Eq34], which as suggested above describes the flows of electron spin magnetization and nuclear spin magnetization. The resulting flow of electron spin magnetization and nuclear spin magnetization may accordingly result in the local concentration of nuclear spin magnetization.

For theoretical insight and function design guidance, if a physically reasonable model of the entropy function (as shown by [Eq33]) can be postulated, and the diffusion rates of the system are comparable by reasonable postulation, the OZ matrix ansatz (as shown by [Eq39]) may provide rapid numerical simulations, and in some cases closed-form descriptions, of transport phenomena.

On the other hand, for improved simulation accuracy of separatory magnetization transport, with reduced regard for computational cost, thermodynamic functions of entropy and free energy (as shown by [Eq33]) may be derived according to the BLOCKS relations (as shown by [Eq37]), and Onsager transport coefficients may be determined from the time-dependence of the BLOCKS covariance according to Onsager's regression method referenced above.

In summary, implementation of separatory magnetization transport may involve elements of (1) a spin-containing substance and (2) a magnetic polarizing field acting jointly to produce a thermodynamic potential (as shown by [Eq20]), and a gradient magnetic field and a depolarizing magnetic field acting jointly to produce a gradient in the thermodynamic potential of [Eq34]. In the presence of the thermodynamic potential gradient produced, the Zeroth through Third Laws of Thermodynamics may ensure the existence of a controlled flow of magnetization that may be beneficial in various applications, such as medical imaging.

Figure 1A:
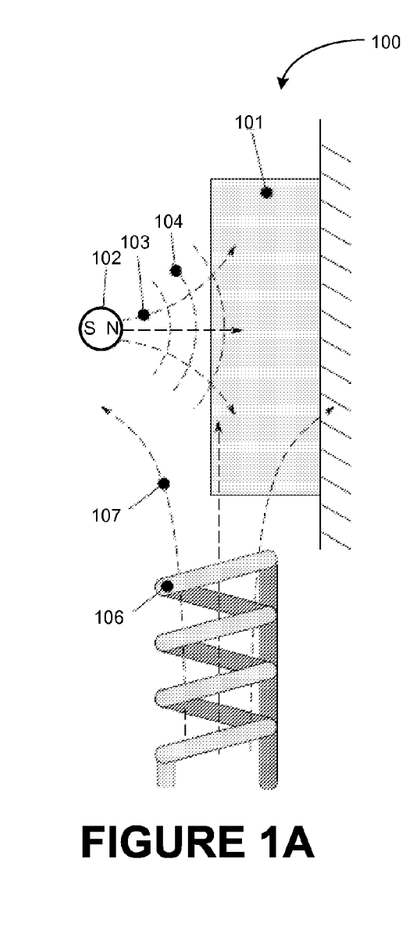
FIG. 1A is a block diagram of a first example apparatus for concentrating magnetization of nuclear spins, in accordance with an example embodiment.

B. Example Embodiments For Separatory Magnetization Transport (i.) First Example Apparatus In light of the discussions above relating to separatory magnetization transport, embodiments including apparatuses and methods are provided. FIG. 1A is a block diagram of a first example apparatus 100 for concentrating magnetization of nuclear spins, in accordance with an example embodiment. As shown, the apparatus 100 includes a body 101, a magnetic device 102, and an alternating-field magnet 106.

As indicated above, the body 101 may include nuclear spin moments and electron spin moments within at least a portion of the body 101. In other words, the body 101 may include any substance with magnetically unpaired electrons. In one example, the body may be a solid body of paramagnetic substance. In other words, the body 101 may be a substance with magnetically unpaired electron spins, or a solid dielectric matrix including polarizing agents whose molecules include one or more paramagnetic centers.

For instance, the body 101 may include polystyrene doped with 2,2-diphenyl-1-picrylhydrazle (DPPH) to any suitable concentration, such as a concentration of about 5 percent. In this instance, the DPPH may provide magnetically-unpaired electron spin moments to the sample, and the polystyrene may contribute to the nuclear spin moments in the substance. In another instance, the body 101 may include nitroxide 2,2,6,6,tetramethylpiperadine-1-oxyl. In a further instance, the body 101 may include 4-hydroxy-2,2,6,6-tetramethylpiperidin-1-oxyl. Other suitable examples of the body may exist.

In one example, the body 101 may have dimensions of about 100 um by 100 um by 10 um. Other sizes and shapes of the body may also be possible. In one case, the dimensions of the body 101 may be constrained due to a size of the apparatus 100. In another case, the dimensions of the body 101 may be sufficiently large such that a static magnetic field 103 provided by the magnetic device 102 across a portion of the body 101 varies across the portion of the body 101. In one example, the apparatus 100 may have dimensions of about 5 mm by 5 mm by 1 mm, or any other suitable dimensions. In some cases, the apparatus 100 may be contained within a cryostatic container that may have dimensions of about 100 cm by 10 cm by 10 cm, or any other suitable dimensions.

Also as indicated above, the magnetic device 102 may be configured to provide a static magnetic field, such as the static magnetic field 103 within the portion of the body 101. In one example, the static magnetic field may be configured to (a) cause a nuclear spin magnetization carried by respective pairs of the nuclear spin moments to be substantially pairwise conserved, (b) substantially align the electron spin moments with a direction of the static magnetic field, and (c) induce a space-varied distribution of magnetic resonance frequencies of respective electron spin moments.

The alignment of the electron spin moments with the direction of the static magnetic field may be due to a polarizing magnetic field component of the static magnetic field, while the space-varied distribution of magnetic resonance frequencies of respective electron spin moments may be due to a gradient magnetic field component of the static magnetic field. The pairwise conservation of the nuclear spin magnetization may be due to the polarizing magnetic field component or a combination of both the polarizing magnetic field component and the gradient magnetic field component. As discussed previously, magnetic interactions between the nuclear spin moments and electron spin moments in the body 101 and the magnetic fields from the magnetic device 102 are such that the Zeroth, First, Second, and third Laws of thermodynamics are respected, as described in Tables 1-7, and particularly equations [30], [34], [35], and [36]. The thermodynamical laws are consonant with the separatory magnetization transport that is described in the tables, particularly by equations [30] and [34].

The magnetic device 102 may include one or more permanent magnets of any ferromagnetic material, such as nickel, iron, cobalt, or rare-earth metal alloys to provide the static magnetic field 103. In one example, the permanent magnet may include samarium-cobalt. Other examples of suitable materials for the permanent magnet may exist.

In one case, the magnetic device may include a first magnetic subdevice and a second magnetic subdevice. The first magnetic subdevice may be configured to provide a first magnetic field component of the static magnetic field 103 to (a) cause a nuclear spin magnetization carried by respective pairs of the nuclear spin moments to be substantially pairwise conserved, (b) substantially align the electron spin moments with a direction of the static magnetic field. In this case, the first magnetic subdevice may be a static magnet, and the first magnetic field component of the static magnetic field 103 may be a polarizing magnetic field.

In another case, the second magnetic subdevice may be configured to provide a second magnetic field component of the static magnetic field 103 to induce a space-varied distribution of magnetic resonance frequencies of respective electron spin moments. In this case, the second magnetic field component of the static magnetic field 103 may be a gradient magnetic field.

Similar to the body 101, the size of the magnetic device 102 may be of any size suitable for the apparatus. In one example, the magnetic device 102 may be a permanent magnet that is 6 mm across. A suitable magnitude of the static magnetic field 103 provided by the magnetic device 102 may vary depending on the concentrations of electron spin moments and nuclear spin moments in the body 101.

In one case, the magnetic device 102 may be selected and/or configured such that a magnitude of the static magnetic field 103 is sufficient to cause the magnetic moments in the body 101 to be substantially pairwise conserved throughout the portion of the body. In one example, if the concentration of spin moments in the body 101 is about 5%, the magnitude of the static magnetic field 103 may be at least 50 mT. In another example, the magnitude of the static magnetic field 103 may be as high as around 10 T. In one example, a distance between the magnetic device 102 and the body 101 within the apparatus 100 may be determined according to the magnitude of the static magnetic field 103 and the size and shape of the body 101. For instance, the distance may be determined such that the magnetic field permeates at least a desired portion of the body 101. Other examples of magnitudes of the magnetic field 103 may exist as well.

As mentioned above and as shown in FIG. 1A, the magnetic device 102 may be configured to provide the static magnetic field 103. In one case, the static magnetic field 103 may be a static, temporally invariant magnetic field. In one example, the static magnetic field 103 may include two magnetic field components, including a polarizing magnetic field component and a gradient magnetic field component. In one case, the magnetic device 102 may include a magnet configured to provide a polarizing magnetic field, and another magnet configured to provide a gradient magnetic field.

The orientation of the magnetic device 102 may be such that the north-south polar axis is perpendicular to a "bowl-shaped" region of the body 101 where nuclear magnetization may concentrate as a result of magnetization flow. As shown in FIG. 1A, the north-south polar axis may in some cases be parallel to a nearest edge of the body 101. In one case, the north-south poles of the magnetic device 102 may be reversed from what is shown in FIG. 1A. Also shown is a plurality of uniform magnetic field strengths 104. In one example, electron and nuclear magnetic moments in the body 101 along one of the plurality uniform magnetic field strengths 104 may be subjected to identical magnetic field strengths.

In one example, the magnetic device 102 may be affixed to a cantilevered beam (not shown). The cantilevered beam may be configured to provide a means of measuring concentrated nuclear magnetization within the body 101, or may simply be configured to provide a mechanical structure to which the magnetic device 102 may be affixed. In one case, any motion of the cantilever may not contribute essentially to the orientation and/or magnitude of the static magnetic field 103 provided by the magnetic device 102. Dimensions of the cantilever beam may be determined according to size limitations of the apparatus 100, such that the cantilever beam fits within the apparatus. In one example, the cantilever 105 may have a length of about 320 micrometers and a thickness of about 0.5 micrometer. Other examples of the size of cantilever 105 may exist as well. In one example, the distance between the magnetic device 102 and the body 101 may be about 1 nm ranging up to 1 mm. Other distances may also be possible.

As also suggested above, the alternating-field magnet 106 may be configured to provide a time-varying magnetic field 107 across the portion of the body 101, wherein the time-varying magnetic field 107 may be configured to induce a spatial gradient in a local magnetization of the respective electron spin moments such that concentrations of nuclear spin magnetizations carried by respective pairs of nuclear spin moments in the body 101 are spatially varied according to the spatial gradient in the local magnetization of the respective electron spin moments. In one example, the time-varying magnetic field 107 may be a depolarizing magnetic field. In one embodiment, the alternating-field magnet 106 may be a radio-frequency coil that is constructed of any electrically conducting material, such as copper. In one example, the alternating-field magnet 106, such as the radio-frequency coil may not have any magnetic material and may therefore not inherently possess any magnetic characteristics. However, the alternating-field magnet 106 may be configured to produce the time-varying magnetic field 107 when an alternating electric current is passed through the alternating-field magnet. In the context of the apparatus 100, the radio frequency coil may be configured to be activated by an alternating current such that the spatial gradient in the local magnetizations of the electron spin moments in the body 101 is dependent on a frequency of the alternating current.

In one example, the time-varying magnetic field 107 may have radio-frequencies according to the magnetic resonance condition $\omega_{rf} = \gamma_e \cdot B(r)$, where $\omega_{rf}$ is the angular frequency of the time-varying magnetic field 107, $\gamma_e$ is the gyromagnetic ration for the electron spins (a physical constant), and $B(r)$ is the magnetic field strength 104 of the static magnetic field 103 at a spatial location r in the body 101. As indicated above, the surfaces of the plurality of uniform magnetic field strengths 104 show representative "slices" or surfaces of uniform magnetic field strength, and thus meet the resonance condition for a specific depolarizing magnetic field angular frequency $\omega_{rf}$. Accordingly, specific "slices" of the body 101 may be affected by the time-varying magnetic field 107. A wide range of depolarizing magnetic field angular frequency $\omega_{rf}$ may be used for the purposes of the present application. For instance, an example range of depolarizing magnetic field angular frequency $\omega_{rf}$ may be from hundreds of megahertz to hundreds of gigahertz. In one example, the depolarizing magnetic field angular frequency $\omega_{rf}$ may be within a range of 1 to 10 GHz.

In operation, the magnetic device 102 may be configured to first provide the static magnetic field 103 prior to the alternating-field magnet 106 providing the time-varying magnet field 107. As suggested above, the presence of the static magnetic field 103 may cause both the electron spin moments and the nuclear spin magnetic moments in the body 101 to become polarized such that the moments are wholly or at least partially aligned with magnetic field lines of the magnetic field 103. Due to spatial variance of the magnitude of the static magnetic field 103 across the body 101, the electron spin magnetic moments produce an electron spin magnetization (magnetic moment per unit volume) that varies throughout the body 101. Similarly, varying nuclear spin magnetization across the body 101 may result from the polarizing of nuclear spin magnetic moments.

After a period of time, the electron spin magnetic moments and nuclear spin magnetic moments in the body 101 affected by the presence of the static magnetic field 103 may reach equilibrium. The period of time may depend on the material of the body 101 and the strength of the static magnetic field 103 across the body 101. In one example, the period of time is about 1 second.

After the period of time, the alternating-field magnet 106 may be activated to produce the time-varying magnetic field 107 to irradiate at least a portion of the body 101 where the nuclear spin magnetic moments and electron spin magnetic moments are at least substantially aligned with the static magnetic field 103. As indicated above, the alternating-field magnet 106 may be a radio-frequency coil that may be activated by passing an alternating current through the radio-frequency coil. Depending on the form of the alternating current, electron spin magnetic moments in at least the portion of the body 101 may be either depolarized or inverted. In either case, a non-equilibrium spatial gradient in the local magnetization of the electron spin moments may be induced. In one example, the electron spin moments in at least the portion of the body 101 may be selected for irradiation by choosing the frequency of the depolarizing field ok such that the resonance condition may be met at the magnetic field strength B(r) corresponding to the spatial position r of the at least portion of the body 101 relative to the alternating-field magnet 106. In other words, as indicated above, the time-varying magnetic field 107 may be configured to induce a spatial gradient in a local magnetization of the respective electron spin moments such that concentrations of nuclear spin magnetizations carried by respective pairs of nuclear spin moments in the body 101 are spatially varied according to the spatial gradient in local magnetization of the respective electron spin moments.

As discussed previously, separatory magnetic transport may involve local concentration of magnetization. In the presence of spatially-varying magnetic fields, separatory magnetic transport locally concentrates magnetization when two magnetic spin species are present, one of which has a locally non-equilibrium spatial gradient. In the operation of the apparatus 100 shown in FIG. 1A, both electron spin magnetic moments and nuclear spin magnetic moments are present in the body 101, the static magnetic field 103 is spatially-varying, and a non-equilibrium spatial gradient in the local magnetization of the electron spin magnetic moments may be induced by irradiating the body 101 with the time-varying magnetic field 107. As such, nuclear spin magnetization may be concentrated in at least the portion of the body 101 according to separatory magnetization transport. The concentration of spin magnetization may vary depending on several parameters, such as the gradient and magnitudes of the static magnetic field 103 across at least the portion of the body 101 and characteristics of the spin moments in the body 101.

(ii.) Second Example Apparatus

In addition to the apparatus 100 discussed above, alternative embodiments derived from the apparatus 100 may also be implemented to apply the concepts of separatory magnetization transport described in the previous section.

Figure 1B:
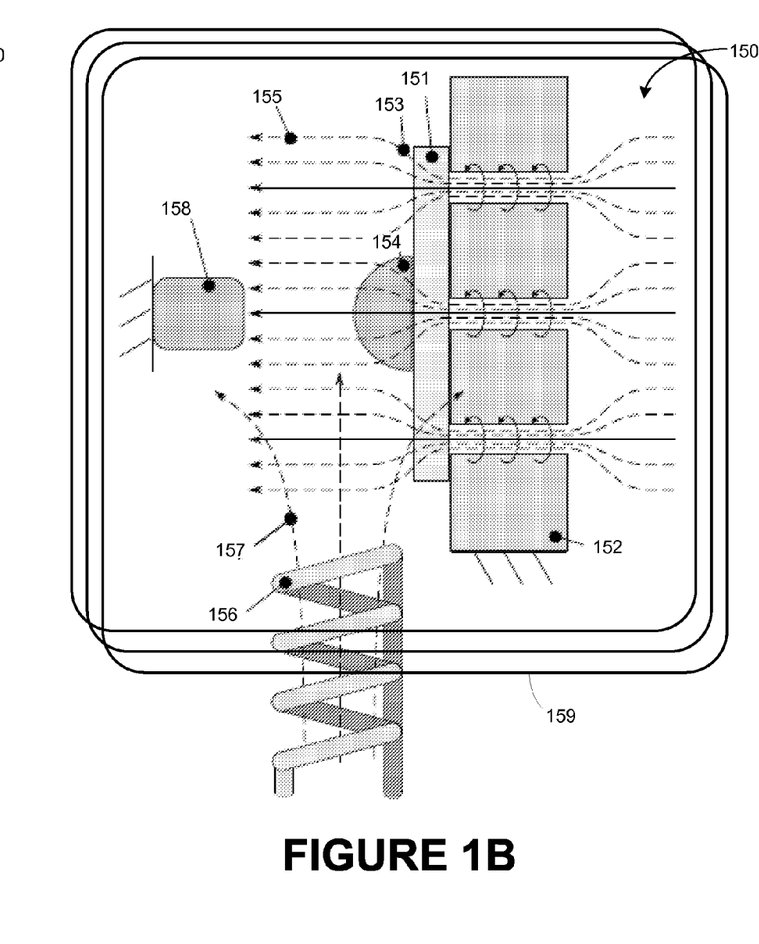
FIG. 1B is a block diagram of a second example apparatus for concentrating magnetization of nuclear spins, in accordance with an example embodiment.

FIG. 1B is a block diagram of a second example apparatus 150 for concentrating magnetization of nuclear spins, in accordance with an example embodiment. As shown, the apparatus 150 may include a body 151, a magnetic device including a superconductor coil 159 and a superconducting material 152, and an alternating-field magnet 156. The body 151 may be similar to the body 101 of the apparatus 100 shown in FIG. 1A.

In one example, the magnetic device may be similar to the magnetic device 102 of the apparatus 100 described above in connection to FIG. 1A. In this case, the superconductor coil 159 may be the first magnetic subdevice, and the superconducting material 152 (in combination with the superconductor coil 159) may accordingly be the second magnetic subdevice. As shown, each of the elements of the apparatus 150 may be contained within the superconducting coil 159. As such, the superconducting coil 159 may be configured to produce a uniform magnetic field 155 across the entire apparatus. In one case, the uniform magnetic field 155 may be a polarizing magnetic field. The superconducting coil 159 as shown in FIG. 1B is meant to be representative only. One having ordinary skill in the art will appreciate that the superconducting coil 159 may be oriented any direction suitable for providing the uniform magnetic field 155 discussed herein.

In this case, the superconducting material 152 may be positioned adjacent to, but not necessarily in contact with the body 151. As shown, the superconductor material 152 may include vortices configured to modify the uniform magnetic field 155 to induce the space-varied distribution of magnetic resonance frequencies of respective electron spin moments. In other words, the vortices of the superconductor material 152 may be configured to funnel the polarizing magnetic field 155, thereby producing a gradient magnetic field 153 across the body 151.

The apparatus 150, as shown in FIG. 1B may also include an alternating-field magnet 156 configured to provide a time-varying magnetic field 157. In one example, the body 151, and the alternating-field magnet 156 may be configured similarly as that of the body 101 and alternating-field magnet 106 of the apparatus 100 of FIG. 1A discussed above. In this case, the time-vary magnetic field 157 may also be a depolarizing magnetic field.

While the apparatus 150 may include a superconducting coil configured to provide the polarizing magnetic field 155, and the superconductor 152 may be configured to produce the gradient magnetic field 153 by funneling the polarizing magnetic field 155 through vortices of the superconductor 152, other configurations for providing the polarizing magnetic field 155 and gradient magnetic field 153 may also be possible. For instance, a static magnet or permanent magnet similar to that of described above in connection with the magnetic device 102 of the apparatus 100 of FIG. 1A may be configured to provide the gradient magnetic field 153, while the superconducting coil may be configured to provide the polarizing magnetic field 155. In one example, dimensions of the superconducting material may be any suitable dimension, such as about 100 um by 100 um by 10 um, and diameters of the vortices may be of any suitable diameters, such as about 5 nm.

In operation, the apparatus 150 may be configured to concentrate nuclear magnetization in at least a portion of the body 151 similar to that described above in reference to the apparatus 100 shown in FIG. 1A, according to the concept of separatory magnetization transport. As suggested previously, the concept of separatory magnetization transport may be utilized in a variety of applications, such as that of medical imaging.

In one example, the apparatus 150 may be configured to receive a biological sample 154 on a location of the body 151. As such, the biological sample 154 may also be subject to the same polarizing magnetic field 155 such that the nuclear and (if applicable) electron spin magnetic moments of the biological sample may become polarized by the polarizing magnetic field 155.

In this case, the alternating-field magnet 156 may be configured to provide a time-varying magnetic field 157 to concentrate nuclear spin magnetizations at substantially the location of the biological sample 154 on the body 151 such that the nuclear spin magnetizations within the body causes diffusion of nuclear spin magnetizations in the biological sample 154.

In one example, for the application of imaging the biological sample 154, the apparatus 150 may also include a sensor 158 configured to detect the concentrated nuclear spin magnetization in the biological sample 154. In one case, the sensor 158 may be a multi-pass cell magnetometer sensor configured to detect biomagnetic signals from the biological sample 154 in a medical imaging application.

(iii.) First Example Method

In addition to the apparatuses 100 and 150 discussed above in connection to FIGS. 1A and 1B, different processes and methods may be implemented to apply the concepts of separatory magnetization transport utilizing apparatuses similar to those of apparatuses 100 and 150.

Figure 2A:
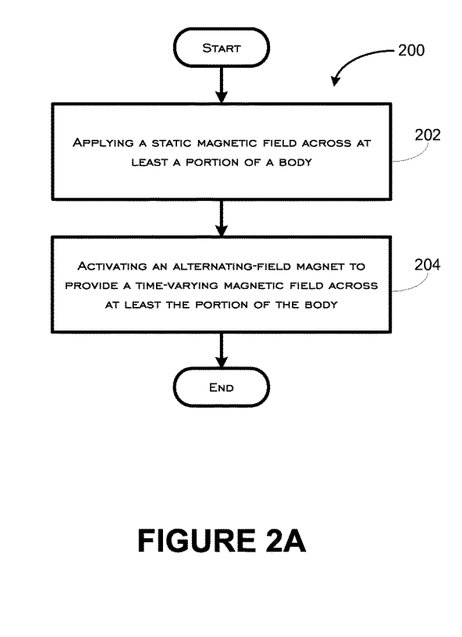
FIG. 2A is a flowchart depicting a first example method for concentrating magnetization of nuclear spins, in accordance with an example embodiment.

FIG. 2A shows a first example flow diagram for concentrating magnetization of nuclear spins, in accordance with at least some embodiments described herein. Method 200 shown in FIG. 2A presents an embodiment of a method that could be used in connection with the apparatus 100 and 150 shown in FIGS. 1A and 1B, respectively. Method 200 may include one or more operations, functions, or actions as illustrated by one or more of blocks 202-204. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 200 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 200 and other processes and methods disclosed herein, each block in FIG. 2A may represent circuitry that is wired to perform the specific logical functions in the process.

As shown, block 202 of the method 200 may involve applying a static magnetic field across at least a portion of a body. In connection with the apparatuses 100 and 150 discussed above, the body may be the body 101 or 151, and the static magnetic field may include a polarizing magnetic field and a gradient magnetic field. As such, the static magnetic field may be configured to (a) cause a nuclear spin magnetization carried by respective pairs of the nuclear spin moments to be substantially pairwise conserved, (b) substantially align the electron spin moments with a direction of the first magnetic field, and (c) induce a space-varied distribution of magnetic resonance frequencies of respective electron spin moments.

Accordingly, the static magnetic field may be provided by a magnetic device such as for example, the magnetic device 102 of the apparatus 100. In this case, the magnetic device 102 may be controllable via a computing device to provide a suitable static magnetic field to achieve the desired nuclear spin magnetization, alignment of electron spin moments, and space-varied distribution of magnetic resonance frequencies of respective electron spin moment.

As described above in connection with the magnetic device 102, applying a static magnetic field across at least a portion of the body may further involve applying a first magnetic field component of the static magnetic field and applying a second magnetic field component of the static magnetic field. In this case, applying the first magnetic field component of the static magnetic field may (a) cause the nuclear spin magnetization carried by respective pairs of the nuclear spin moments to be substantially pairwise conserved and (b) substantially align the electron spin moments with a direction of the static magnetic field. Accordingly, applying the second magnetic field component of the static magnetic field may induce a space-varied distribution of magnetic resonance frequencies of respective electron spin moments.

Referring back to the method 200, block 204 of the method 200 may involve activating an alternating-field magnet to provide a time-varying magnetic field across at least the portion of the body. In connection with the apparatus 100 discussed above, the alternating-field magnet may be the alternating-field magnet 106, and the time-varying magnetic field may be time-varying magnetic field 107. As such, the time-varying magnetic field may be configured to induce a spatial gradient in the local magnetizations of the electron spin moments such that concentrations of nuclear spin magnetizations carried by respective pairs of nuclear spin moments in at least the portion of the body are spatially variable according to the spatial gradient in the local magnetization of the respective electron spin moments. As with the case of the alternating-field magnet 106 of the apparatus 100, the alternating-field magnet include a radio-frequency coil such that activating the alternating-field magnet to provide a time-varying magnetic field across at least the portion of the body may involve applying an alternating current to the radio-frequency coil in which the spatial gradient in local magnetizations of the electron spin moments in the body may be dependent on a frequency of the alternating current. As with the case of the magnetic device, the alternating-field magnet may be controllable via a computing device to provide a time-varying magnetic field to induce the desired spatial gradient in local magnetizations of the electron spin moments.

(iv.) Second Example Method

Figure 2B:
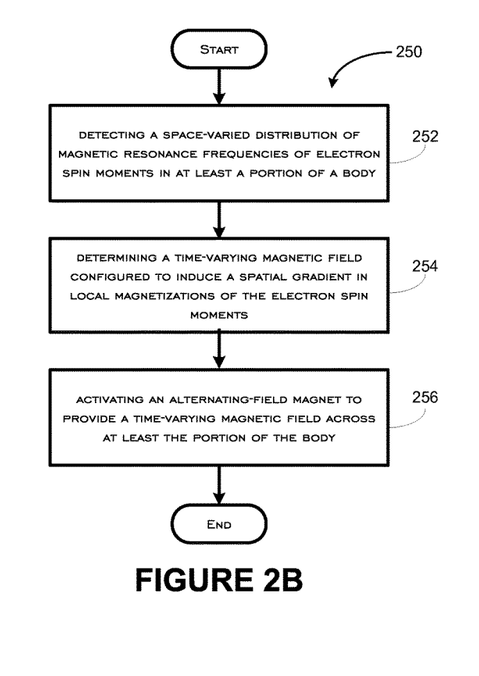
FIG. 2B is a flowchart depicting a second example method for concentrating magnetization of nuclear spins, in accordance with an example embodiment.

FIG. 2B shows a second example flow diagram for concentrating magnetization of nuclear spins, in accordance with at least some embodiments described herein. Method 240 shown in FIG. 2B presents an embodiment of a method that could be used in connection with the apparatus 100 and 150 shown in FIGS. 1A and 1B, respectively. Method 250 may include one or more operations, functions, or actions as illustrated by one or more of blocks 252-256. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

As shown, block 252 of the method 250 may involve detecting a space-varied distribution of magnetic resonance frequencies of electron spin moments in at least a portion of a body. In connection with the apparatus 100 of FIG. 1A, block 252 may involve detecting the effects of the static magnetic field 103 on the electron spin moments in the body 101.

At block 254, the method 250 may involve determining a time-varying magnetic field based on the detected space-varied distribution of magnetic resonance frequencies, such that the time-varying magnetic field may induce a spatial gradient in local magnetizations of the electron spin moments such that concentrations of nuclear spin magnetizations carried by respective pairs of nuclear spin moments in the body are spatially varied according to the spatial gradient in the local magnetization of the respective electron spin moments.

A block 256, the method 250 may involve activating an alternating-field magnet such as the alternating magnet 106 to provide the time-varying magnetic field across at least the portion of the body. As suggested above, the time-varying magnetic field may induce a spatial gradient in local magnetizations of the electron spin moments such that concentrations of nuclear spin magnetizations in the body are spatially varied.

In one example, the alternating-field magnet may be controllable via a computing device to provide a time-varying magnetic field to induce the desired spatial gradient in local magnetizations of the electron spin moments. In this case, the computing device may further be configured to detect or receive data indicating space-varied distribution of magnetic resonance frequencies of electron spin moments in at least a portion of a body as discussed in connection to block 252, and subsequently determine the time-varying magnetic field based on the detected or received data as discussed in connection to block 254.

Further, similar to that discussed in connection with apparatus 150 of FIG. 1B, a biological sample may be positioned at a location on the body. In this case, activating an alternating-field magnet to provide a time-varying magnetic field across at least the portion of the body as described in block 256 may further involve concentrating nuclear spin magnetizations at substantially the location of the biological sample on the body such that the nuclear spin magnetizations within the body causes diffusion of nuclear spin magnetizations in the biological sample. In this case, the computing device may further be configured to receive from a sensor data indicating nuclear spin magnetization detected in the biological sample. In one example, the sensor may be the sensor 158 of the apparatus 150 of FIG. 1B.

(v.) Example Computer Readable Medium

Figure 3:
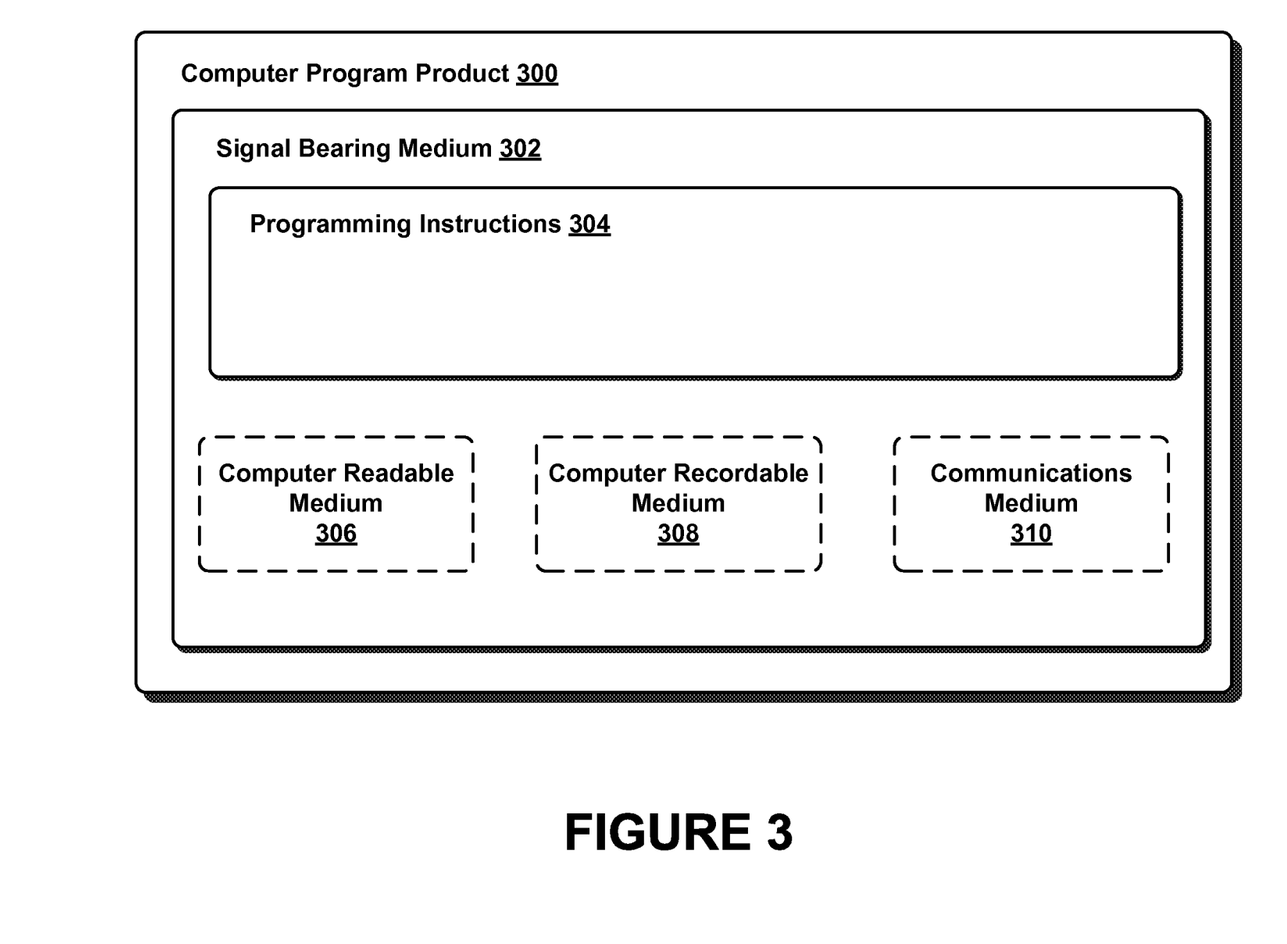
FIG. 3 is a computer-readable medium, in accordance with an example embodiment.

As indicated above, in some embodiments, the disclosed methods may be implemented by computer program instructions encoded on a non-transitory computer-readable storage media in a machine-readable format, or on other non-transitory media or articles of manufacture. FIG. 3 is a schematic illustrating a conceptual partial view of an example computer program product that includes a computer program for executing a computer process on a computing device, arranged according to at least some embodiments presented herein.

In one embodiment, the example computer program product 300 may be provided using a signal bearing medium 302. The signal bearing medium 302 may include one or more programming instructions 304 that, when executed by one or more processors may provide functionality or portions of the functionality described with respect to FIGS. 2A and 2B. In some examples, the signal bearing medium 302 may encompass a non-transitory computer-readable medium 306, such as, but not limited to, a hard disk drive, a Compact Disc (CD), a Digital Video Disk (DVD), a digital tape, memory, etc. In some implementations, the signal bearing medium 302 may encompass a computer recordable medium 308, such as, but not limited to, memory, read/write (R/W) CDs, R/W DVDs, etc. In some implementations, the signal bearing medium 302 may encompass a communications medium 310, such as, but not limited to, a digital and/or an analog communication medium (e.g., a fiber optic cable, a waveguide, a wired communications link, a wireless communication link, etc.). Thus, for example, the signal bearing medium 302 may be conveyed by a wireless form of the communications medium 310.

The one or more programming instructions 304 may be, for example, computer executable and/or logic implemented instructions. In some examples, a processing unit of a computing device may be configured to provide various operations, functions, or actions in response to the programming instructions 304 conveyed to the processing unit by one or more of the computer readable medium 306, the computer recordable medium 308, and/or the communications medium 310.

The non-transitory computer readable medium could also be distributed among multiple data storage elements, which could be remotely located from each other. The computing device that executes some or all of the stored instructions could be a computing device such as any of those described above. Alternatively, the computing device that executes some or all of the stored instructions could be another computing device, such as a server.

C. Conclusion

While various aspects and embodiments have been disclosed herein, it should be understood that the embodiments are example embodiments and are described in connection to just some of many possible applications. Accordingly, it should also be understood that other aspects and embodiments are also possible. The various aspects and embodiments disclosed herein are for purposes of illustration and are not intended to be limiting, with the true scope and spirit being indicated by the following claims.

We claim:

1. An apparatus comprising:
    a body comprising nuclear spin moments and electron spin moments within at least a portion of the body;
    a magnetic device configured to provide a static magnetic field within the portion of the body, wherein the static magnetic field is configured to (a) cause a nuclear spin magnetization carried by respective pairs of the nuclear spin moments to be substantially pairwise conserved, (b) substantially align the electron spin moments with a direction of the static magnetic field, and (c) induce a space-varied distribution of magnetic resonance frequencies of respective electron spin moments; and
    an alternating-field magnet configured to provide a time-varying magnetic field across the portion of the body, wherein the time-varying magnetic field is configured to induce a spatial gradient in a local magnetization of the respective electron spin moments such that concentrations of the nuclear spin magnetizations carried by respective pairs of the nuclear spin moments are spatially varied according to the spatial gradient in local magnetization of the respective electron spin moments.

2. The apparatus of claim 1, wherein the magnetic device comprises a first magnetic subdevice and a second magnetic subdevice, wherein the first magnetic subdevice is configured to provide a first magnetic field component of the static magnetic field to (a) cause the nuclear spin magnetization carried by respective pairs of the nuclear spin moments to be substantially pairwise conserved and (b) substantially align the electron spin moments with a direction of the static magnetic field, and wherein the second magnetic subdevice is configured to provide a second magnetic field component of the static magnetic field to induce a space-varied distribution of magnetic resonance frequencies of respective electron spin moments.

3. The apparatus of claim 2, wherein the first magnetic subdevice comprises a superconducting coil configured to produce a uniform magnetic field across the apparatus.

4. The apparatus of claim 3, wherein the second magnetic subdevice comprises a superconductor material comprising vortices configured to modify the uniform magnetic field to induce the space-varied distribution of magnetic resonance frequencies of respective electron spin moments.

5. The apparatus of claim 1, wherein the body comprises a substance with magnetically unpaired electrons.

6. The apparatus of claim 1, wherein the magnetic device comprises a permanent magnet.

7. The apparatus of claim 1, wherein the static magnetic field has a magnitude within a range of about 50 mT to about 10 T.

8. The apparatus of claim 1, wherein the body is configured to receive a biological sample at a location on the body, and wherein the alternating-field magnet is configured to concentrate nuclear spin magnetizations at substantially the location of the biological sample on the body such that the nuclear spin magnetization within the body causes diffusion of nuclear spin magnetizations in the biological sample.

9. The apparatus of claim 8, further comprising a sensor, wherein the sensor is configured to detect nuclear spin magnetization in the biological sample.

10. The apparatus of claim 9, wherein the sensor is a multi-pass cell magnetometer sensor configured to detect biomagnetic signals from the biological sample in a medical imaging application.

11. The apparatus of claim 1, wherein the alternating-field magnet comprises a radio-frequency coil, and wherein the radio frequency coil is configured to be activated by an alternating current such that the spatial gradient in local magnetizations of the electron spin moments is dependent on a frequency of the alternating current.

12. The apparatus of claim 1, wherein the static magnetic field is configured to provide a magnetic field magnitude sufficient to cause the nuclear spin magnetization to be substantially pairwise conserved throughout the portion of the body.

13. A method comprising:
    applying a static magnetic field across at least a portion of a body to (a) cause a nuclear spin magnetization carried by respective pairs of the nuclear spin moments to be substantially pairwise conserved, (b) substantially align the electron spin moments with a direction of the first magnetic field, and (c) induce a space-varied distribution of magnetic resonance frequencies of respective electron spin moments; and
    activating an alternating-field magnet to provide a time-varying magnetic field across at least the portion of the body, wherein the time-varying magnetic field is configured to induce a spatial gradient in local magnetizations of the electron spin moments such that concentrations of the nuclear spin magnetizations carried by respective pairs of nuclear spin moments in at least the portion of the body are spatially variable according to the spatial gradient in local magnetization of the respective electron spin moments.

14. The method of claim 13, wherein applying a static magnetic field across at least a portion of the body comprises:
applying a first magnetic field component of the static magnetic field to (a) cause the nuclear spin magnetization carried by respective pairs of the nuclear spin moments to be substantially pairwise conserved and (b) substantially align the electron spin moments with a direction of the static magnetic field; and
applying a second magnetic field component of the static magnetic field to induce a space-varied distribution of magnetic resonance frequencies of respective electron spin moments.

15. The method of claim 13, wherein the alternating-field magnet comprises a radio-frequency coil, and wherein activating an alternating-field magnet to provide a time-varying magnetic field across at least the portion of the body comprises:
applying an alternating current to the radio-frequency coil, wherein the spatial gradient in local magnetizations of the electron spin moments is dependent on a frequency of the alternating current.

16. A non-transitory computer readable medium having stored thereon instructions executable by a computing device to cause the computing device to perform functions comprising:
detecting a space-varied distribution of magnetic resonance frequencies of electron spin moments in at least a portion of a body;
determining a time-varying magnetic field based on the detected space-varied distribution of magnetic resonance frequencies of electron spin moments, wherein the time-varying magnetic field is configured to induce a spatial gradient in local magnetizations of the electron spin moments such that concentrations of nuclear spin magnetizations in the body are spatially varied according to the spatial gradient in local magnetization of the respective electron spin moments; and
activating an alternating-field magnet to provide the time-varying magnetic field across at least the portion of the body.

17. The non-transitory computer readable medium of claim 16, wherein the space-varied distribution of magnetic resonance frequencies of electron spin moments in at least the portion of the body is induced by a static magnetic field provided by a magnetic device.

18. The non-transitory computer readable medium of claim 16, wherein a biological sample is positioned at a location on the body, and wherein activating an alternating-field magnet to provide a time-varying magnetic field across at least the portion of the body comprises:
concentrating nuclear spin magnetizations at substantially the location of the biological sample on the body such that the nuclear spin magnetizations within the body cause diffusion of nuclear spin magnetizations in the biological sample.

19. The non-transitory computer readable medium of claim 18, wherein the functions further comprise:
receiving from a sensor data indicating nuclear spin magnetization detected in the biological sample.

20. The non-transitory computer readable medium of claim 19, wherein the sensor is a multi-pass cell magnetometer sensor configured to detect biomagnetic signals from the biological sample in a medical imaging application.

21. A method comprising:
detecting a space-varied distribution of magnetic resonance frequencies of electron spin moments in at least a portion of a body;
determining a time-varying magnetic field based on the detected space-varied distribution of magnetic resonance frequencies of electron spin moments, wherein the time-varying magnetic field is configured to induce a spatial gradient in local magnetizations of electron spin moments such that concentrations of nuclear spin magnetizations in the body are spatially varied according to the spatial gradient in local magnetization of the respective electron spin moments; and
activating an alternating-field magnet to provide the time-varying magnetic field across at least the portion of the body.

* * * * *